(12) United States Patent
Vogel et al.

(10) Patent No.: US 10,850,300 B2
(45) Date of Patent: Dec. 1, 2020

(54) HOLDING DEVICE FOR THE SURFACE TREATMENT OF BAR CUTTERS

(71) Applicant: Oerlikon Surface Solutions AG, Pfäffikon, Pfäffikon SZ (CH)

(72) Inventors: Remo Vogel, Buchs (CH); Robert Eugene Stewart, Harrison, MI (US); Phillip J. Laforce, Taylor, MI (US)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 15/511,717

(22) PCT Filed: Sep. 17, 2015

(86) PCT No.: PCT/EP2015/071323
§ 371 (c)(1),
(2) Date: Mar. 16, 2017

(87) PCT Pub. No.: WO2016/042077
PCT Pub. Date: Mar. 24, 2016

(65) Prior Publication Data
US 2017/0297048 A1 Oct. 19, 2017

Related U.S. Application Data

(60) Provisional application No. 62/051,471, filed on Sep. 17, 2014.

(51) Int. Cl.
*B05C 13/02* (2006.01)
*B05C 21/00* (2006.01)
(Continued)

(52) U.S. Cl.
CPC ............ *B05C 13/02* (2013.01); *B05C 21/005* (2013.01); *B23P 6/00* (2013.01); *B23P 15/28* (2013.01);
(Continued)

(58) Field of Classification Search
CPC ..... C23C 14/505; C23C 14/042; B25H 3/003; B25H 3/021; B25H 3/04
(Continued)

(56) References Cited

U.S. PATENT DOCUMENTS 6,037,004 A * 3/2000 Zajchowski ............ B05B 12/20
427/282
8,323,409 B2 * 12/2012 Schlichting ........... C23C 14/505
118/500
(Continued)

FOREIGN PATENT DOCUMENTS

EP 2 204 470 A1 7/2010

OTHER PUBLICATIONS

International Search Report for PCT/EP2015/071323 dated Jan. 12, 2016.

*Primary Examiner* — Lee D Wilson
*Assistant Examiner* — Seahee Hong
(74) *Attorney, Agent, or Firm* — Pearne & Gordon LLP

(57) ABSTRACT

A holding device for fastening bar cutters in order for the cutting edges thereof to be coated, wherein the fastening is configured in such a way that a plurality of bar cutters can be arranged in a row such that the cutting faces and tips thereof have the same orientation, and the holding device includes a screen which at least partially protects the cutting faces from the coating, wherein, with bar cutters arranged in a row in the manner described, the top edge of the screen projects beyond the knife tips in such a way that no knife tips protrude.

19 Claims, 6 Drawing Sheets

(51) Int. Cl.
*C23C 16/458* (2006.01)
*C23C 14/50* (2006.01)
*C23C 14/04* (2006.01)
*C23C 16/04* (2006.01)
*B23P 6/00* (2006.01)
*B23P 15/28* (2006.01)
*B25B 11/00* (2006.01)

(52) U.S. Cl.
CPC .......... *B25B 11/002* (2013.01); *C23C 14/044* (2013.01); *C23C 14/50* (2013.01); *C23C 16/042* (2013.01); *C23C 16/458* (2013.01)

(58) Field of Classification Search
USPC .............. 15/256.61; 427/282, 255.5; 206/354
See application file for complete search history.

(56) References Cited

U.S. PATENT DOCUMENTS

| | | | |
|---|---|---|---|
| 8,703,240 B2 | 4/2014 | Stout | |
| 9,010,823 B1* | 4/2015 | Murray | A47F 5/03 |
| | | | 294/143 |
| 2004/0055917 A1* | 3/2004 | Stern | B25H 3/003 |
| | | | 206/373 |
| 2007/0104871 A1* | 5/2007 | Stout | B23F 21/126 |
| | | | 427/282 |
| 2011/0041278 A1* | 2/2011 | Moncavage | B41F 15/44 |
| | | | 15/236.01 |
| 2013/0177707 A1* | 7/2013 | Feuerstein | C23C 14/505 |
| | | | 427/282 |
| 2013/0264169 A1 | 10/2013 | Heine-Kempkens | |
| 2014/0328637 A1* | 11/2014 | Stout | B23F 21/126 |
| | | | 407/119 |
| 2016/0076131 A1* | 3/2016 | Siebert | C23C 14/042 |
| | | | 427/299 |

* cited by examiner

HOLDING DEVICE FOR THE SURFACE TREATMENT OF BAR CUTTERS

The present invention relates to a holding device for the surface treatment of bar cutters. Furthermore, the present invention relates to a holding device for the coating of 2 and 3 side-grinding bar cutters.

BACKGROUND

The surfaces of many objects are nowadays treated in order to achieve certain surface properties.

The surfaces of components and tools are nowadays often considerably improved by coatings for specific applications.

In this respect, the choice of the right substrate holder plays a very important role for each surface treatment process. Therefore, appropriate substrate holders are being developed for specific surface treatment processes, taking into account the type of substrate surface to be treated as well as further substrate properties (such as for example substrate shape, dimensions and composition).

Coating is nowadays a commonplace surface treatment for substrates. In this respect, layers with particular properties are deposited on certain substrate surfaces. The coating affords the substrate surfaces enhanced properties that enable the use of these substrates for particular applications or make possible a performance increase of these substrates for a particular application.

For example, in the case of cutting tools, the cutting faces are usually (at least partially) coated with wear protection layers in order to increase the cutting performance of these tools.

Despite such a coating, wear will occur over time when the tools are used. Particularly in the case of bar cutters, the coating is often ground down and the edge of the blade is coated again.

A bar cutter is generally formed from a bar with a square cross-section. However, the cross-section of a bar cutter can be provided with any number of edges, so that it can have for example a pentagonal, hexagonal, octagonal etc. shape.

FIG. 1 shows an example of such a square bar cutter of the 2-side grinding type. It comprises a shaft 120 and a cutting extremity. The cutting extremity comprises a first and a second surface resp. an open surface 103 and a secondary open surface 105, as well as a cutting face. The first and second surfaces converge in a roof-like shape, with the "gable" being designed rounded. The cutting face is a flat front side connecting the first and second surfaces. The cutting face and first surface form a cutting edge 101 by means of which material is to be removed from a blank. The surface 110 is coated and is not subjected to regrinding.

FIG. 4 shows in contrast to FIG. 1 a bar cutter of the 3-side grinding type. This differs by the grinding on the machining face which, in contrast to the 2-side grinding, occurs only in the area of the bar cutter head. This entails that during each subsequent grinding, the cutting face 401, 403, 405, 410 also needs to be subjected to regrinding in order to maintain a constant quality. This is not the case for the 2-side grinding. In the case of 3-side grinding bar cutters, all reground surfaces are then generally coated again for the next use.

In order to reduce the wear of this cutting edge, the latter is coated with a wear protection layer. Despite such a coating, wear will occur over time when the tools are used. Particularly in the case of bar cutters, the coating is often ground down for the edge of the blade to be coated again.

In this connection, the so-called 2 face method (in the context of the present invention also called 2-side grinding method) has been mainly used so far, wherein ultimately only the first and the second surfaces 103, 105 are subjected to re-grinding. However, in previous years, the 3-side grinding method has increasingly established itself, wherein in addition to the first and second surfaces 403, 405 the third surface 410 is also subjected to re-grinding.

In the case of the 2-side grinding method, the coating is left on the cutting face. The result, however, is that, when the process is repeated all too often, the thickness of the coating on the cutting face keeps increasing and for example after the fourth or fifth time spalling occurs, which of course negatively affect the performance of the bar cutter.

In document U.S. Pat. No. 8,703,240, this problem is countered in that the cutting face is masked. The masking occurs in such a manner that only peripheral areas of 1 mm or less of the cutting face remain uncovered. During coating, only these uncoated peripheral areas of the cutting face as well as the first and second surfaces are coated and thus also the cutting face. This is shown in FIG. 2. The uncoated peripheral areas are represented in cross-hatched manner. When the bar cutter is subjected to re-grinding on the first and second surfaces, at least part of the uncovered peripheral areas are removed. When the tool is reconditioned repeatedly (re-grinding and masked coating), there is consequently no excessive layer buildup on the cutting face.

The disadvantage of this method, however, is that for each kind of bar cutter an expensive masking needs to be produced. Furthermore, adjusting the bar cutters relative to the masking must be performed with exceptional accuracy, which makes the process considerably more complicated.

Another solution regarding the problem mentioned above is the 3-face method (in the context of the present invention also called 3-side grinding method), according to which the cutting face is also additionally subjected to grinding. In this case, no layer remains on the bar cutter and the grinding and re-coating can be repeated much more often without damaging spalling occurring. The disadvantage is of course that now one additional surface is subjected to re-grinding. Since the coating is a hard material coating, a removal of the coating is laborious, i.e. grinding an additional surface entails an additional effort.

It would therefore be desirable to have available a holding device and a method on the basis of the 2-face method with which the tool reconditioning can be performed without significant additional effort and for the most varied bar cutter.

For the coating of 3-side grinding bar cutters and 2-side grinding bar cutters various holding variants are used nowadays.

For example, for the coating of 3-side grinding bar cutters a holding device variant is used in which the bar cutters are loaded onto a magnetic plate. In this respect, the shafts of the bar cutters are covered with an additional metal sheet. On such a magnetic plate, only two rows can be loaded and the loading density is thus very low.

For the coating of 2-side grinding bar cutters, for example, a holding device variant is used in which the bar cutters are held in a ring-shaped holder, such that only the side surfaces are coated. The bar cutters in this respect are oriented vertically, as shown in FIG. 5.

The holder solutions available so far are not flexible in terms of the holder cross-section, therefore specific holders are respectively required for different cross-sections.

For the efficient coating of both 2-side and 3-side grinding bar cutters in a same batch, no suitable holding device variants are currently available.

SUMMARY OF THE INVENTION

One aim of the present invention is to provide a versatile holding device for the surface coating of bar cutters, with which a plurality of re-conditioning cycles can be performed with the 2-side grinding method without this resulting in an excessive layer buildup on the cutting face.

It is a further aim of the present invention to provide a versatile holding device for the surface coating of bar cutters, with which 2-side and 3-side grinding bar cutters can be coated in the same coating batch and with which the 2-side grinding bar cutters can be coated in such a manner that a plurality of re-conditioning cycles can be performed with the 2-side grinding method without this resulting in an excessive layer buildup on the cutting face.

The aim of the present invention is achieved in that a holding device with open design, as described in claim 1, is provided. Dependent claims relate to advantageous embodiments of the present invention.

DETAILED DESCRIPTION

Figure 1:
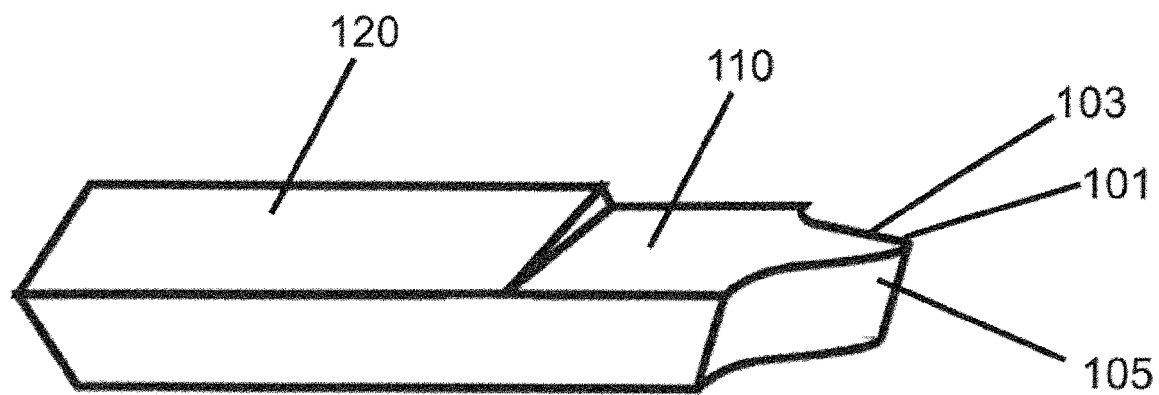
FIG. 1 shows an example of a square bar cutter.
Figure 2:
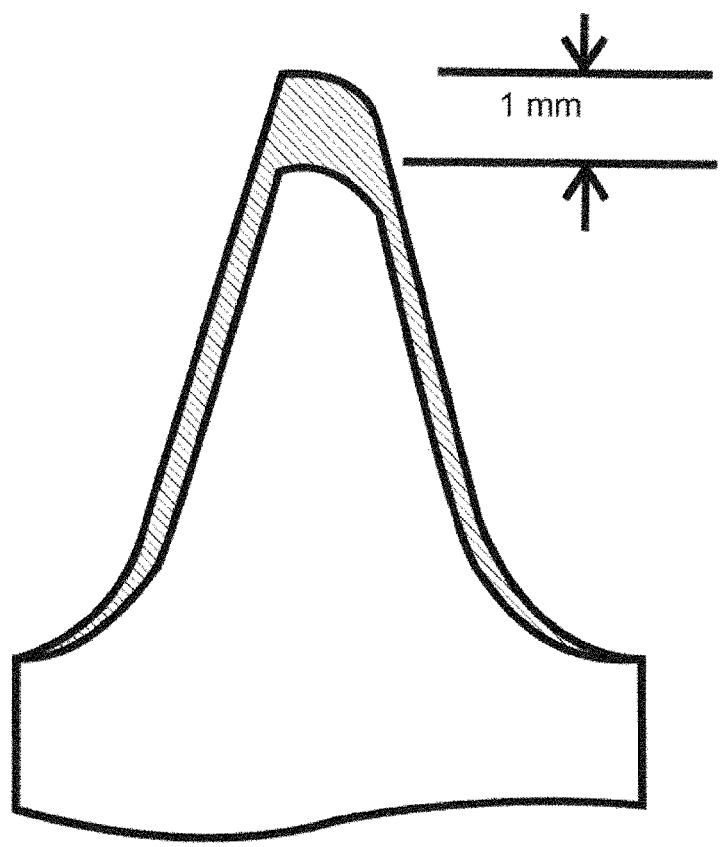
FIG. 2 shows uncoated peripheral areas of the cutting face of a cutter.
Figure 3:
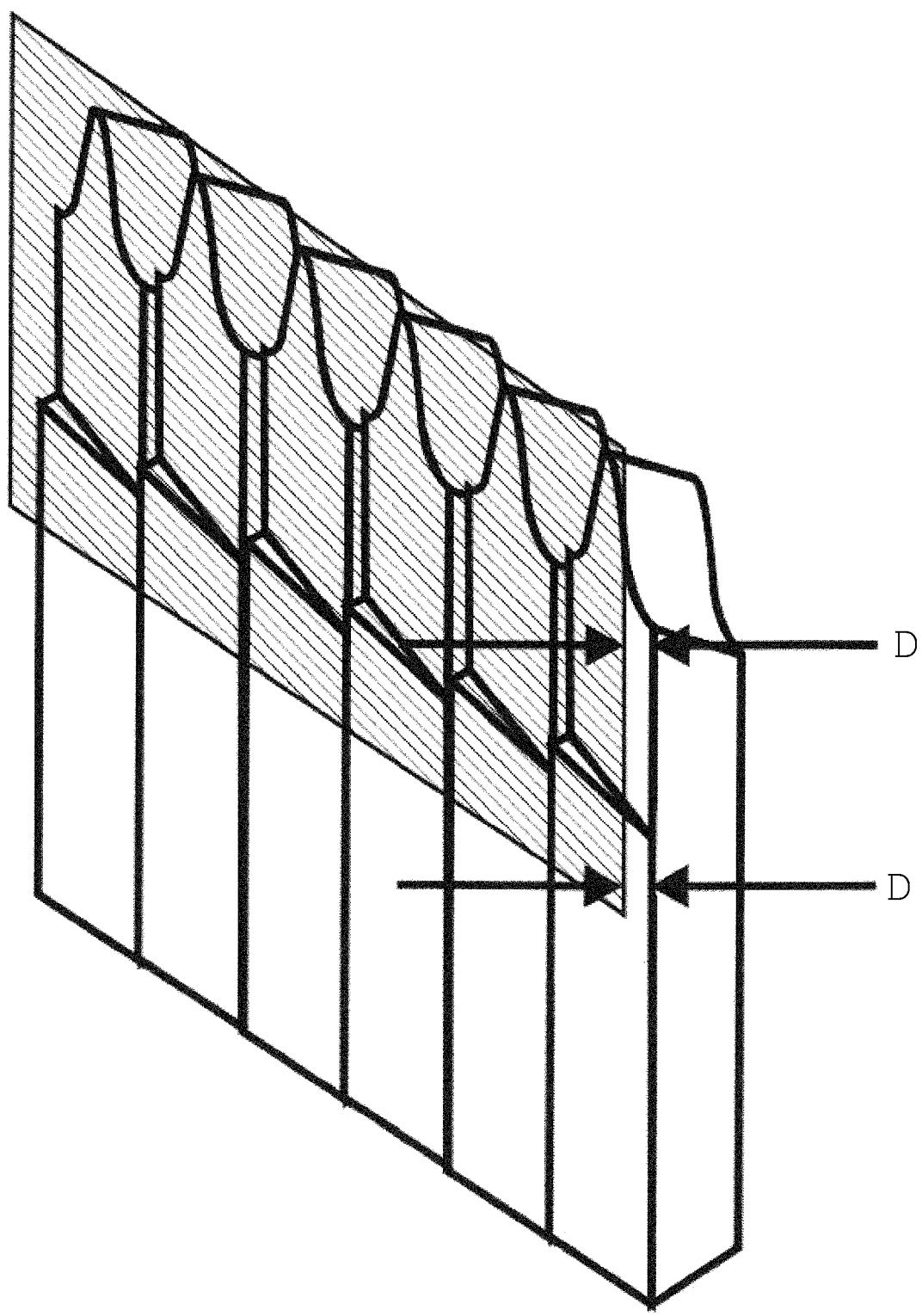
FIG. 3 shows a row of bar cutters.
Figure 4:
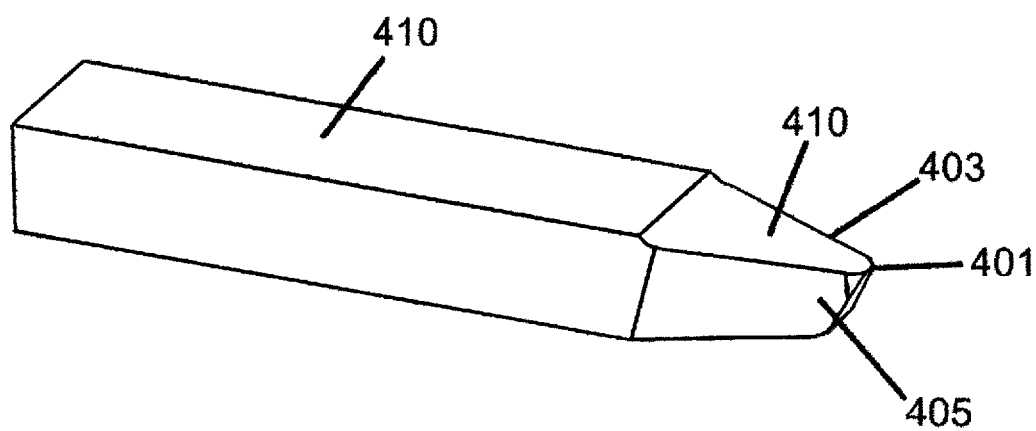
FIG. 4 shows a 3-sided grinding-type bar cutter.
Figure 5:
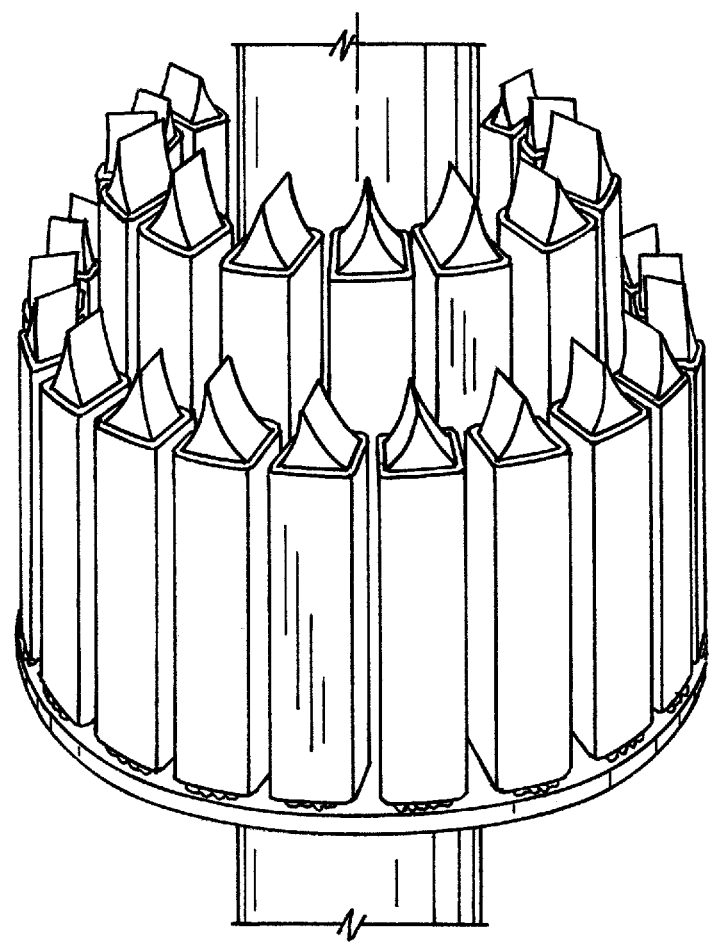
FIG. 5 shows bar cutters in a ring-shaped holder.

The invention is based essentially on the effect of shading. Accordingly, the bar cutters are arranged in rows in a holder and the cutting face is protected from the coating by a screen (hereinafter also called coating shield). In particular, a top edge of a screen projects beyond the one of the rows in such a way that no blade tips of the one of the rows protrude beyond the top edge of the screen. This covers the cutting faces completely, i.e. does not follow the profile of the cutting extremities. This is in contrast to the masking known from U.S. Pat. No. 8,703,240. The screen can even extend over the tip of the bar cutter. According to the invention, and in a preferred manner, the screen is however not in contact with the cutting face but at a distance from the latter (see, for example, distance D in FIG. 3). The distance can be between 1 mm and 10 mm, preferably between 1 mm and 5 mm, and even more preferably is 3 mm. This results, during the coating of the bar cutters, in the first and second surfaces being fully exposed to the coating application, whereas the coating application on the cutting face due to the shading effect of the screen still occurs, but to a clearly reduced extent. On the cutting face, a coating is formed whose thickness, starting from the cutting edge, clearly decreases. Surprisingly, it is not only the area of the tip of the bar cutter that is sufficiently coated beyond the edge, but also the area surrounding the edge.

After use and wear of the bar cutter, the first and second surfaces are then subjected to grinding according to the 2-face method. Since only the areas close around the edges of the cutting face are coated and this is removed after the first, second or at the latest third grinding process, this does not result in a multiple layer buildup. According to the invention, it is thus possible to achieve without a complicated and adapted masking device that, after several re-conditioning cycles, a detrimental multiple layer buildup on the cutting face can be avoided.

Figure 6:
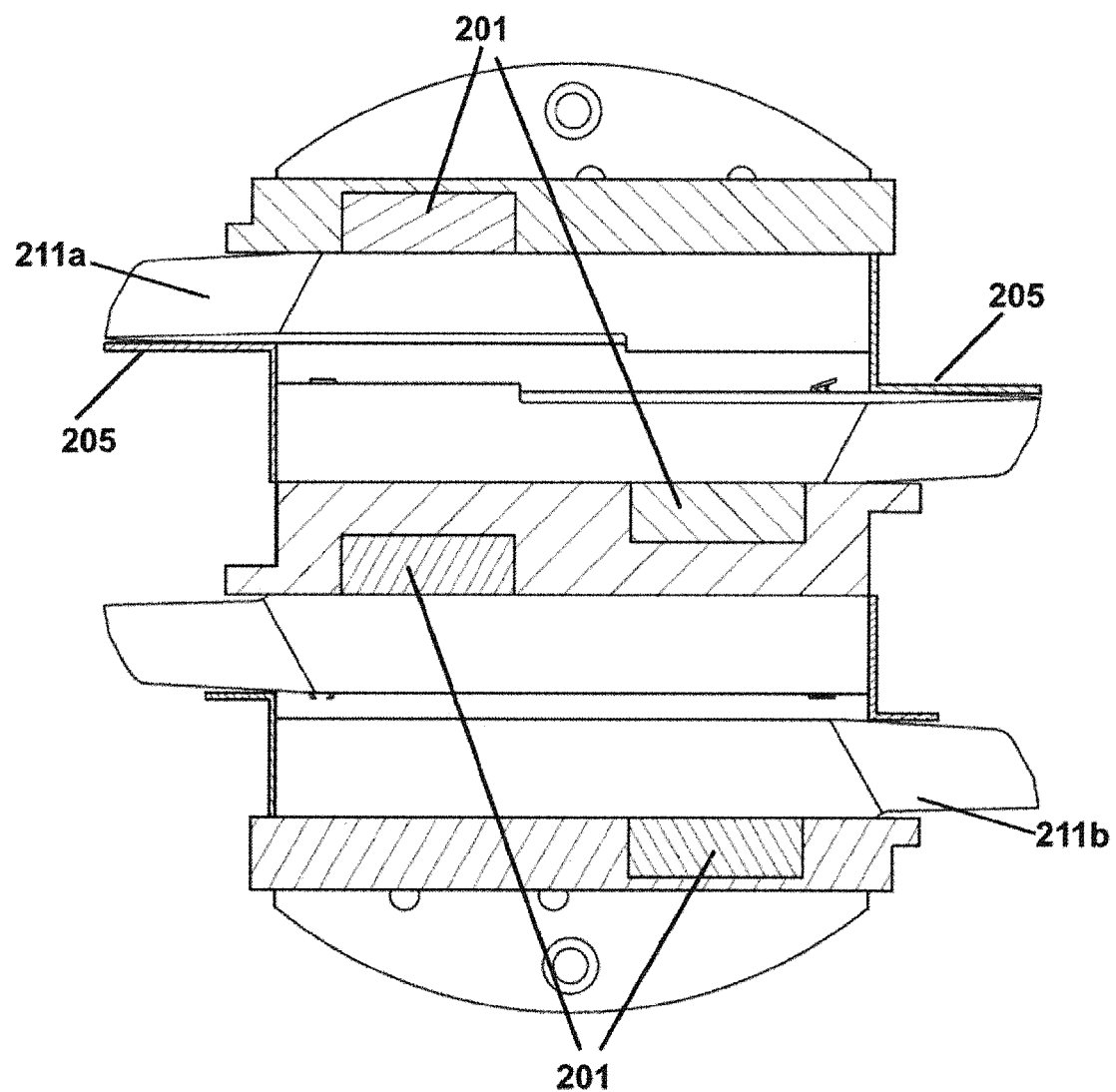
FIG. 6 shows a detailed view of a holding device.
Figure 7:
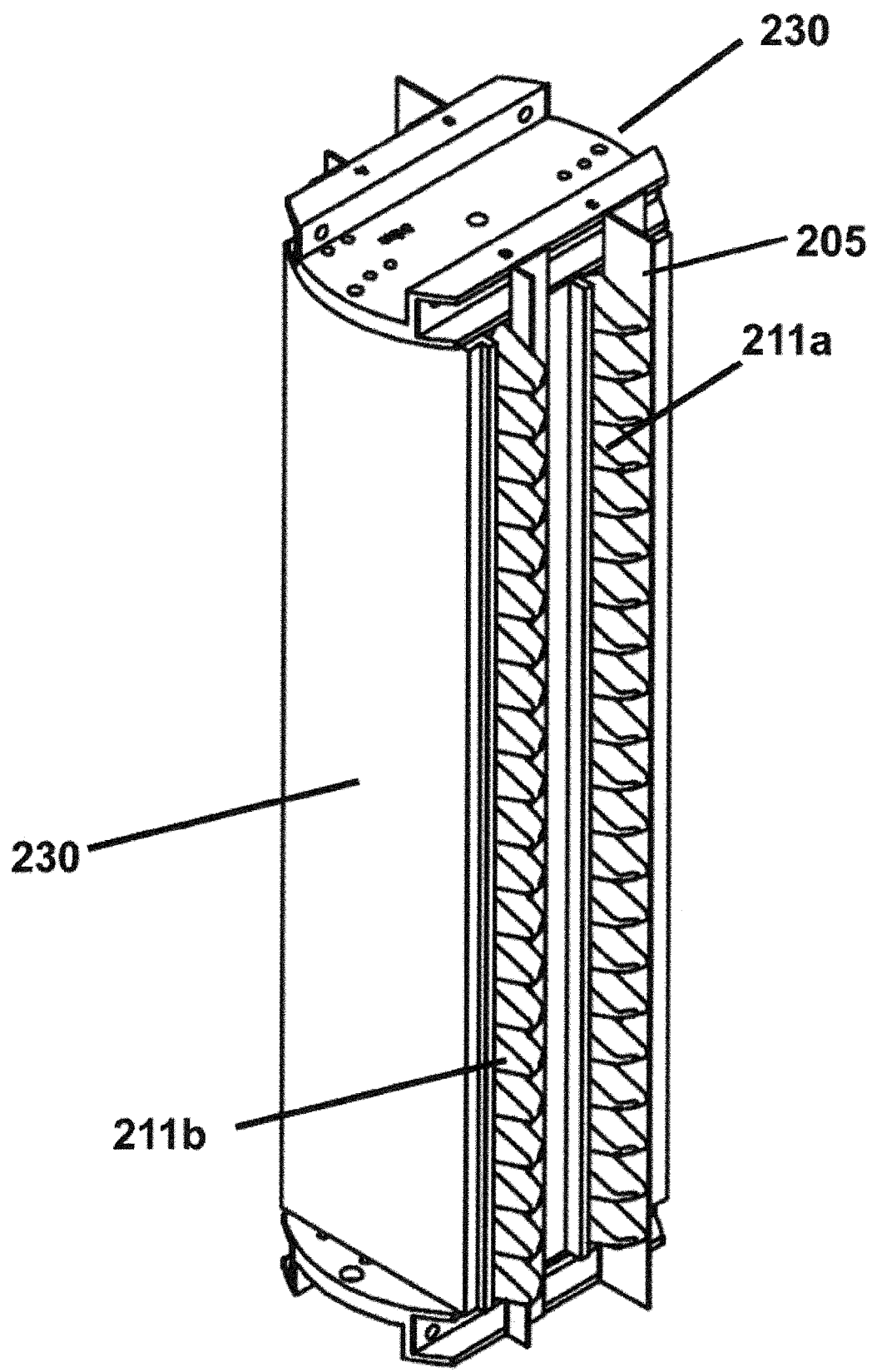
FIG. 7 shows an isometric view of the holding device.

According to a preferred embodiment of an inventive holding device, an optimal loading can be achieved in that a design with four rows of bar cutters is implemented, as shown in FIGS. 6 and 7. The bar cutters 211a, 211b project on two sides out of the holder in order to allow an optimal coating result. The bar cutters 211a, 211b are held via magnets 201. The flexibility of the holder is achieved via a freely adjustable coating shield 205. This allows 2-side grinding bar cutters 211a and 3-side grinding bar cutters 211b to be coated, bar cutters with a smaller cross-section can also be coated. In this respect, the gaps arising between the bar cutters are closed by a coating shield. The easy adjustability of the coating shield 205 is achieved via the magnets 201 that can for example be provided as magnetic strip and can be placed at the top and at the bottom on the holder.

This holding device according to the present invention is, by comparison with the state of the art, more flexible in terms of the cross-section of bar cutters, since it allows the simple loading of bar cutters with different cross-sections, and thus the efficient coating of bar cutters of different sizes (both with different lengths as well as with different cross-sections) in the same batch. This flexibility is achieved among others by means of the easily adjustable coating shield 205, as mentioned above. Depending on the cross-section of the bar cutter, it can be moved into the desired position in order to achieve an optimal distance between cutting face and coating shield.

It is thus possible to coat in each row another type of bar cutter without having to reconfigure the holder.

Additional flexibility is achieved through the adjustable lateral outer metal sheets 230. This functionality makes it possible to achieve that, if a bar cutter with small cross-section is coated, the lateral outer metal sheet 230 can be displaced inwards. This has the advantage that in a facility with a certain amount of space, the useful areas can be used in an optimal manner and the loading for bar cutters with larger bar cutter length can be increased even when available space is restricted.

Additionally, the use of a holding device according to the present invention makes it possible to achieve an increased quality of the coating of 2-side grinding bar cutters due to the horizontal coating.

What is claimed is:

1. An assembly comprising:
   a holding device; and
   a plurality of bar cutters, each bar cutter having a cutting face, a cutting edge, and a blade tip,
   wherein the plurality of bar cutters are fastened to the holding device for coating the cutting edges thereof,
   wherein the plurality of bar cutters are fastened in such a way that the plurality of bar cutters are arranged in rows, each row having multiple bar cutters of the plurality of bar cutters and being parallel to the other rows,
   wherein for each row, the multiple bar cutters of the row are aligned parallel to each other such that their blade tips are directed in the same direction,
   wherein the holding device comprises an elongated screen which extends parallel to one of the rows and at least partially protects the multiple bar cutters of the one of the rows from the coating, wherein the elongated screen extends in the direction of the blade tips of the one of the rows in such a way that the elongated screen extends past the blade tips of the one of the rows and no blade tips of the one of the rows protrude beyond the elongated screen, and wherein the elongated screen completely covers each cutting face of the one of the rows in a direction normal to the cutting face.

2. The assembly according to claim 1, wherein the elongated screen is at a distance from the cutting faces of the one of the rows such that the cutting faces of the one of the rows face the elongated screen and a gap is formed between the elongated screen and the cutting faces of the one of the rows.

3. The assembly according to claim 2, wherein the distance is between 1 mm and 10 mm.

4. The assembly according to claim 2, wherein the distance is between 1 mm and 5 mm.

5. The assembly according to claim 1, wherein the elongated screen is adjustable.

6. The assembly according to claim 5, wherein the plurality of bar cutters are arranged in four rows and the holding device comprises magnets for fastening the plurality of bar cutters.

7. The assembly according to claim 6, wherein the bar cutters in two of the four rows are 2-side grinding bar cutters and the bar cutters in the other two of the four rows are 3-side grinding bar cutters.

8. The assembly according to claim 6, wherein the holding device comprises adjustable lateral outer metal sheets.

9. The assembly according to claim 1, wherein the elongated screen is movable such that a distance between the elongated screen and the cutting faces of the row can be adjusted.

10. The assembly according to claim 1, wherein:
the holding device includes a main body, the main body being an elongated body that extends longitudinally along a vertical axis and includes a top end and a bottom end; and
the elongated screen is adjustably coupled via an upper magnetic strip provided at the top end of the main body and a lower magnetic strip provided at the bottom end of the main body.

11. The assembly according to claim 1, wherein:
the holding device includes a main body defining a plurality of fastening surfaces, each fastening surface being configured such that a row of the plurality of bar cutters is fastened thereto,
the plurality of fastening surfaces includes a first fastening surface, a second fastening surface, a third fastening surface, and a fourth fastening surface,
the main body includes a first magnet that magnetically couples a first row of the plurality of bar cutters to the first fastening surface,
the main body includes a second magnet that magnetically couples a second row of the plurality of bar cutters to the second fastening surface,
the main body includes a third magnet that magnetically couples a third row of the plurality of bar cutters to the third fastening surface, and
the main body includes a fourth magnet that magnetically couples a fourth row of the plurality of bar cutters to the fourth fastening surface, and
the first fastening surface and third fastening surface face a first direction and the second fastening surface and fourth fastening surface face a second direction opposite to the first direction.

12. The assembly according to claim 11, wherein the first fastening surface faces the second fastening surface, and the third fastening surface faces the fourth fastening surface.

13. The assembly according to claim 11, wherein the plurality of fastening surfaces extend parallel to each other, and the holding device includes a plurality of the elongated screens that extend longitudinally parallel to the plurality of fastening surfaces.

14. The assembly according to claim 1, wherein:
the holding device includes a main body, the main body being an elongated body that extends longitudinally along a vertical axis and includes a top end and a bottom end; and
the elongated screen extends from the top end of the main body to the bottom end of the main body.

15. The assembly according to claim 1, wherein the elongated screen has an L-shaped cross-section.

16. The assembly according to claim 1, wherein the plurality of bar cutters are arranged in at least a first row and a second row parallel to and offset from the first row, the bar cutters in the first row being arranged such that their blade tips are directed toward a first direction and the bar cutters in the second row being arranged such that their blade tips are directed toward a second direction opposite the first direction.

17. The assembly according to claim 1, wherein the plurality of bar cutters are arranged in a first row, a second row, a third row, and a fourth row that are parallel to and offset from each other, further wherein the bar cutters in the first row and third row are arranged such that their blade tips are directed toward a first direction and the bar cutters in the second row and fourth row are arranged such that their blade tips are directed toward a second direction opposite the first direction.

18. A holding device comprising:
a plurality of bar cutters,
a holder to which the bar cutters are attached such that cutting faces and tips of several bar cutters of the plurality of bar cutters have the same orientation, and
a screen that at least partially protects the cutting faces of the several bar cutters from being coated, wherein
the several bar cutters and the screen are aligned such that the screen is spaced from the cutting faces of the several bar cutters and projects form the tips of the several bar cutters such that no tips of the several bar cutters project past the screen, and
wherein the screen completely covers each cutting face of the several bar cutters in a direction normal to the cutting face.

19. An assembly comprising:
a holding device that includes a main body, the main body being an elongated body that extends longitudinally along a vertical axis and includes a top end and a bottom end; and
a plurality of bar cutters, each bar cutter having a cutting face, a cutting edge, and a blade tip,
wherein the plurality of bar cutters are fastened to the holding device for coating the cutting edges thereof,
wherein the plurality of bar cutters are fastened in such a way that the plurality of bar cutters are arranged in rows, each row having multiple bar cutters of the plurality of bar cutters and being parallel to the other rows,
wherein for each row, the multiple bar cutters of the row are aligned parallel to each other such that their blade tips are directed in the same direction, wherein the holding device comprises an elongated screen which extends parallel to one of the rows and at least partially protects the multiple bar cutters of the one of the rows from the coating, wherein the elongated screen extends in the direction of the blade tips of the one of the rows in such a way that the elongated screen extends past the blade tips of the one of the rows and no blade tips of the one of the rows protrude beyond the elongated screen, and wherein the elongated screen is adjustably coupled via an upper magnetic strip provided at the top end of the main body and a lower magnetic strip provided at the bottom end of the main body.

* * * * *